US012794443B2

(12) United States Patent
Kimura et al.

(10) Patent No.: US 12,794,443 B2
(45) Date of Patent: Nov. 10, 2026

(54) ACOUSTIC WAVE DEVICE

(71) Applicant: Murata Manufacturing Co., Ltd., Nagaokakyo (JP)

(72) Inventors: Tetsuya Kimura, Nagaokakyo (JP); Kazunori Inoue, Nagaokakyo (JP); Katsumi Suzuki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 631 days.

(21) Appl. No.: 18/367,516

(22) Filed: Sep. 13, 2023

(65) Prior Publication Data

US 2023/0421129 A1 Dec. 28, 2023

Related U.S. Application Data

(63) Continuation of application No. PCT/JP2022/015392, filed on Mar. 29, 2022.

(Continued)

(51) Int. Cl.

*H03H 9/00* (2006.01)
*H03H 9/02* (2006.01)
*H03H 9/13* (2006.01)

(52) U.S. Cl.

CPC .......... *H03H 9/13* (2013.01); *H03H 9/02015* (2013.01); *H03H 9/02157* (2013.01)

(58) Field of Classification Search

CPC .. H03H 9/13; H03H 9/02015; H03H 9/02157; H03H 3/02; H03H 9/02228;

(Continued)

(56) References Cited

U.S. PATENT DOCUMENTS

2004/0021530 A1 2/2004 Tamazaki et al.
2014/0152145 A1* 6/2014 Kando .............. H03H 9/02574 29/25.35

(Continued)

FOREIGN PATENT DOCUMENTS

CN 111434037 A 7/2020
CN 112039467 A 12/2020

(Continued)

OTHER PUBLICATIONS

International Search Report in PCT/JP2022/015392, mailed Jun. 14, 2022, 3 pages.

(Continued)

*Primary Examiner* — Julio C. Gonzalez
(74) *Attorney, Agent, or Firm* — Keating & Bennett, LLP

(57) ABSTRACT

An acoustic wave device includes a piezoelectric layer including first and second main surfaces opposed to each other, a functional electrode on at least one of the first and second main surfaces, and a support substrate on a second main surface side of the piezoelectric layer. A hollow portion is between the support substrate and the piezoelectric layer. The functional electrode at least partially overlaps the hollow portion when viewed in a laminating direction in which the support substrate and the piezoelectric layer are laminated. A through-hole extends through the piezoelectric layer to the hollow portion. A raised portion extending along a depth direction of the through-hole is on an inner wall of the through-hole.

20 Claims, 12 Drawing Sheets

Related U.S. Application Data

(60) Provisional application No. 63/168,311, filed on Mar. 31, 2021.

(58) Field of Classification Search
CPC ........... H03H 9/02574; H03H 9/02559; H03H 9/14541; H03H 9/172; H03H 9/25
See application file for complete search history.

(56) References Cited

U.S. PATENT DOCUMENTS

| | | | | |
|---|---|---|---|---|
| 2020/0295730 | A1 | 9/2020 | Nagatomo et al. | |
| 2023/0223914 | A1* | 7/2023 | Nagatomo ......... | H03H 9/02228 310/349 |

FOREIGN PATENT DOCUMENTS

| | | | |
|---|---|---|---|
| JP | 2004072719 | A | 3/2004 |
| JP | 2007208728 | A | 8/2007 |
| JP | 2012257019 | A | 12/2012 |
| JP | 2019009671 | A | 1/2019 |
| JP | 2019117992 | A | 7/2019 |

OTHER PUBLICATIONS

Written Opinion in PCT/JP2022/015392, mailed Jun. 14, 2022, 3 pages.

Official Communication issued in corresponding Chinese Patent Application No. 202280023419.1, mailed on Jun. 16, 2026, 8 pages.

* cited by examiner

ACOUSTIC WAVE DEVICE

CROSS REFERENCE TO RELATED APPLICATIONS

This application claims the benefit of priority to Provisional Patent Application No. 63/168,311 filed on Mar. 31, 2021 and is a Continuation Application of PCT Application No. PCT/JP2022/015392 filed on Mar. 29, 2022. The entire contents of each application are hereby incorporated herein by reference.

BACKGROUND OF THE INVENTION

1. Field of the Invention

The present invention relates to an acoustic wave device.

2. Description of the Related Art

Conventionally, an acoustic wave device including a piezoelectric layer made of lithium niobate or lithium tantalate is known.

Japanese Unexamined Patent Application Publication No. 2012-257019 discloses an acoustic wave device including a support having a hollow portion, a piezoelectric substrate that is provided on the support so as to overlap the hollow portion, and an interdigital transducer (IDT) electrode that is provided on the piezoelectric substrate so as to overlap the hollow portion, in which a plate wave is excited by the IDT electrode, and an end edge portion of the hollow portion does not include a linear part that extends parallel with a propagation direction of the plate wave excited by the IDT electrode.

SUMMARY OF THE INVENTION

In an acoustic wave device such as the one described in Japanese Unexamined Patent Application Publication No. 2012-257019, there is a possibility that production efficiency decreases and a piezoelectric layer is easily damaged in a case where a hollow portion is formed by providing a through-hole in the piezoelectric layer.

Preferred embodiments of the present invention provide acoustic wave devices in each of which a piezoelectric layer is less likely to be damaged during production.

An acoustic wave device according to a preferred embodiment of the present invention includes a piezoelectric layer including a first main surface and a second main surface that are opposed to each other, a functional electrode on at least one of the first main surface and the second main surface of the piezoelectric layer, and a support substrate on a second main surface side of the piezoelectric layer, wherein a hollow portion is between the support substrate and the piezoelectric layer, the functional electrode at least partially overlaps the hollow portion when viewed in a laminating direction in which the support substrate and the piezoelectric layer are laminated, a through-hole extends through the piezoelectric layer and reaches the hollow portion, and a raised portion extending along a depth direction of the through-hole is on an inner wall of the through-hole.

According to preferred embodiments of the present invention, it is possible to provide acoustic wave devices in each of which a piezoelectric layer is less likely to be damaged during production.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Acoustic wave devices according to preferred embodiments of the present invention are described below.

In an acoustic wave device according to a preferred embodiment of the present invention, a raised portion that extends along a depth direction of a through-hole passing through a piezoelectric layer and reaching a hollow portion is provided on an inner wall of the through-hole. In a case where the raised portion is provided on the inner wall of the through-hole, an etching solution is easily introduced in a case where the hollow portion is formed by a method that will be described later, and therefore an etching period can be shortened. As a result, unnecessary damage is less likely to be given to the piezoelectric layer.

In first, second, and third aspects of preferred embodiments of the present invention, the acoustic wave devices according to preferred embodiments of the present invention include a piezoelectric layer made of lithium niobate or lithium tantalate and a first electrode and a second electrode that face each other in a direction crossing a thickness direction of the piezoelectric layer.

In the first aspect, a bulk wave in a thickness-shear mode such as a thickness-shear first-order mode is preferably used, for example. In the second aspect, the first electrode and the second electrode are adjacent electrodes, and d/p is about 0.5 or less, for example, where d is a thickness of the piezoelectric layer and p is a center-to-center distance between the first electrode and the second electrode. With the configuration, in the first and second aspects, a Q factor can be increased even in a case where a size is reduced.

In the third aspect, a Lamb wave as a plate wave is preferably used, for example. Resonance characteristics caused by the Lamb wave can be obtained.

In a fourth aspect, an acoustic wave device according to a preferred embodiment of the present invention includes a piezoelectric layer made of lithium niobate or lithium tantalate and an upper electrode and a lower electrode that face each other in a thickness direction of the piezoelectric layer with the piezoelectric layer interposed therebetween. In the fourth aspect, a bulk wave is preferably used, for example.

The present invention will be made apparent by describing specific preferred embodiments of the present invention with reference to the drawings.

The drawings below are schematic ones, and dimensions, scale ratios such as horizontal to vertical ratios, and the like may be different from those of an actual product.

Each preferred embodiment described herein is illustrative, and partial replacement or combination of configurations between different preferred embodiments is possible. Furthermore, in a case where the preferred embodiments are not distinguished, the expression "acoustic wave device according to a preferred embodiment of the present invention" is used.

Figure 1:
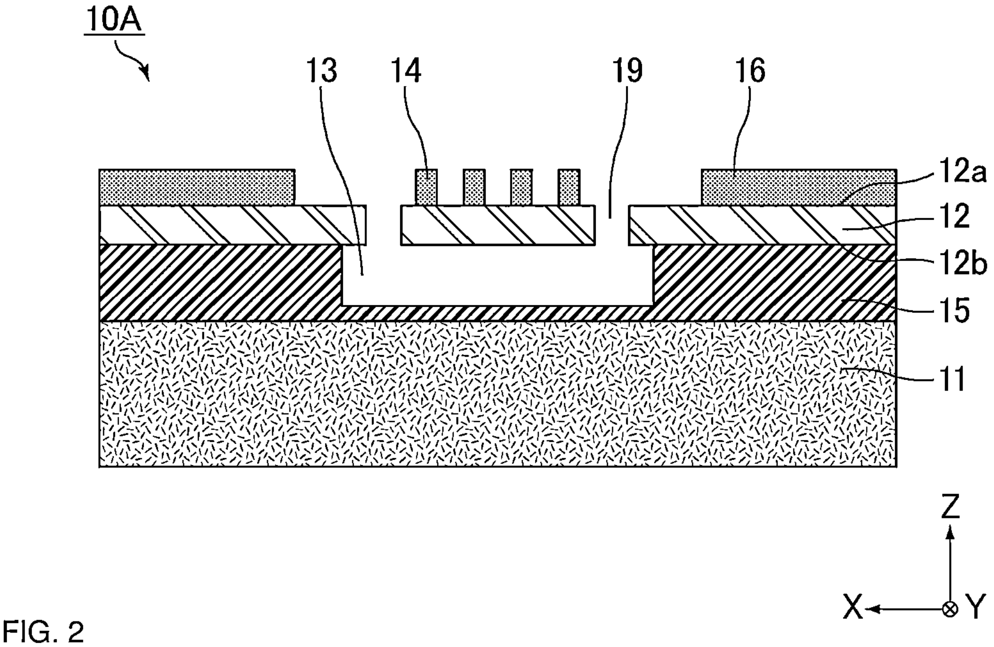
FIG. 1 is a cross-sectional view schematically illustrating an acoustic wave device according to a preferred embodiment of the present invention.
Figure 2:
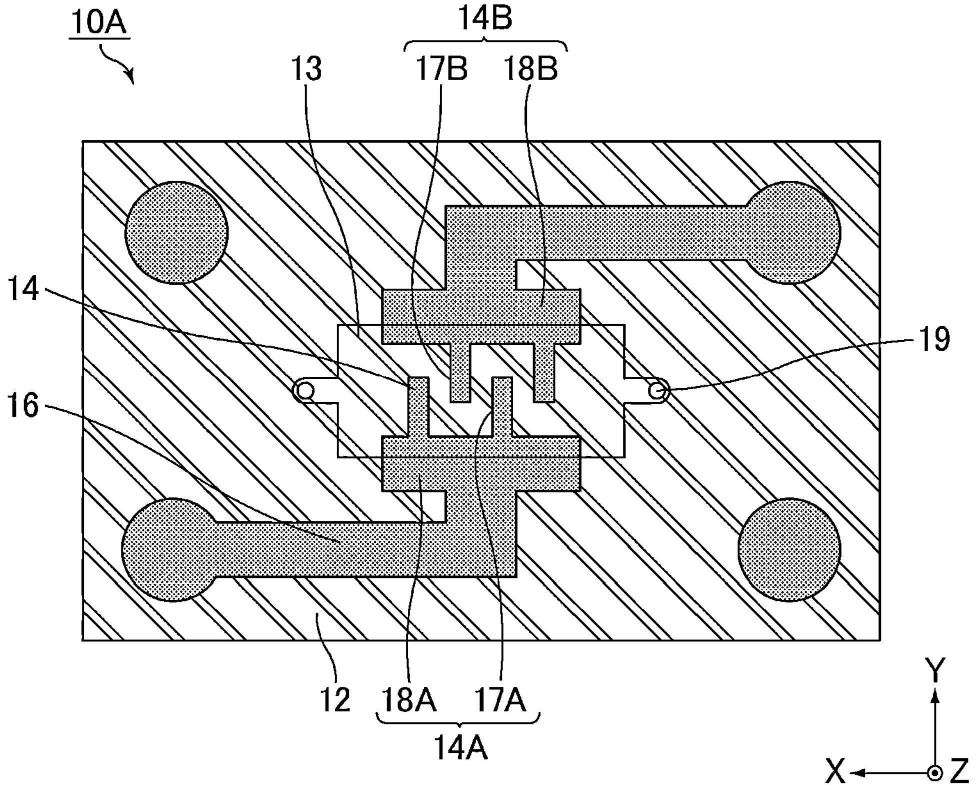
FIG. 2 is a top view schematically illustrating an acoustic wave device according to a preferred embodiment of the present invention.

FIG. 1 is a cross-sectional view schematically illustrating an acoustic wave device according to a preferred embodiment of the present invention. FIG. 2 is a top view schematically illustrating the acoustic wave device according to the present preferred embodiment of the present invention.

An acoustic wave device 10A illustrated in FIGS. 1 and 2 includes a support substrate 11, an intermediate layer 15 laminated on the support substrate 11, and a piezoelectric layer 12 laminated on the intermediate layer 15. The piezoelectric layer 12 includes a first main surface 12*a* and a second main surface 12*b* that are opposed to each other. A plurality of electrodes (e.g., functional electrodes 14) are provided on the piezoelectric layer 12.

The intermediate layer 15 includes a hollow portion 13 that is opened on a piezoelectric layer 12 side. The hollow portion 13 may be provided in a portion of the intermediate layer 15 or may pass through the intermediate layer 15. The hollow portion 13 may be provided in the support substrate 11. In this case, the hollow portion 13 may be provided in a portion of the support substrate 11 or may pass through the support substrate 11. Note that the intermediate layer 15 need not necessarily be provided. That is, the hollow portion 13 just needs to be provided between the support substrate 11 and the piezoelectric layer 12.

The support substrate 11 is, for example, made of silicon (Si). A material of the support substrate 11 is not limited to this, and can be, for example, a piezoelectric body such as aluminum oxide, lithium tantalate, lithium niobate, or crystal, ceramics such as alumina, sapphire, silicon nitride, aluminum nitride, silicon carbide, zirconia, cordierite, mullite, steatite, or forsterite, a dielectric such as diamond or glass, a semiconductor such as gallium nitride, or a resin.

The intermediate layer 15 is, for example, made of silicon oxide ($SiO_x$). In this case, the intermediate layer 15 may be made of $SiO_2$. A material of the intermediate layer 15 is not limited to this, and, can be, for example, silicon nitride ($Si_xN_y$). In this case, the intermediate layer 15 may be made of $Si_3N_4$.

The piezoelectric layer 12 is, for example, made of lithium niobate ($LiNbO_x$) or lithium tantalate ($LiTaO_x$). In this case, the piezoelectric layer 12 may be made of $LiNbO_3$ or $LiTaO_3$.

The plurality of electrodes include at least one pair of functional electrodes 14 and a plurality of wiring electrodes 16 connected to the functional electrodes 14. In the example illustrated in FIGS. 1 and 2, the functional electrodes 14 are provided on the first main surface 12*a* of the piezoelectric layer 12.

The functional electrodes 14 at least partially overlap the hollow portion 13 when viewed in a laminating direction (the Z direction in FIGS. 1 and 2) in which the support substrate 11 and the piezoelectric layer 12 are laminated.

As illustrated in FIG. 2, the functional electrodes 14 include, for example, a first electrode 17A (hereinafter also referred to as a first electrode finger 17A) and a second electrode 17B (hereinafter also referred to as a second electrode finger 17B) that face each other, a first busbar electrode 18A to which the first electrode 17A is connected, and a second busbar electrode 18B to which the second electrode 17B is connected. The first electrode 17A and the first busbar electrode 18A constitute a first comb-shaped electrode (first IDT electrode), which is a first functional electrode 14A, and the second electrode 17B and the second busbar electrode 18B define a second comb-shaped electrode (second IDT electrode), which is a second functional electrode 14B.

The functional electrodes 14 are made of an appropriate metal or alloy such as Al or an AlCu alloy. For example, the functional electrodes 14 have a structure in which an Al layer is laminated on a Ti layer. Note that a close contact layer other than a Ti layer may be used.

The wiring electrodes 16 are made of an appropriate metal or alloy such as Al or an AlCu alloy. For example, the wiring electrodes 16 have a structure in which an Al layer is laminated on a Ti layer. Note that a close contact layer other than a Ti layer may be used.

The piezoelectric layer 12 has a through-hole 19 that passes through the piezoelectric layer 12 and reaches the hollow portion 13. In the example illustrated in FIGS. 1 and 2, the through-hole 19 is provided on an outer side relative to the functional electrodes 14 in the X direction. Although a position of the through-hole 19 is not limited in particular, the through-hole 19 passes through the piezoelectric layer 12 at a position that does not overlap the functional electrodes 14 when viewed in the laminating direction in which the support substrate 11 and the piezoelectric layer 12 are laminated. The through-hole 19 is, for example, used as an etching hole in a production step that will be described later.

Figure 3:
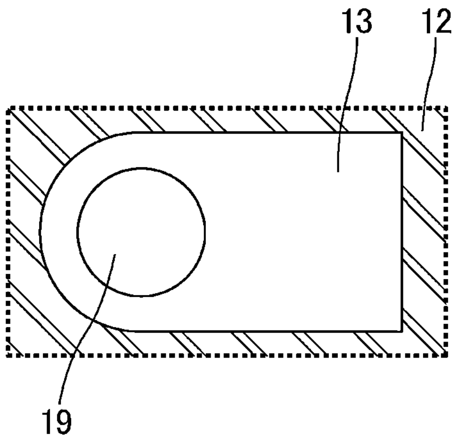
FIG. 3 is an enlarged top view of an example of a peripheral portion of a through-hole in FIG. 2.
Figure 4:
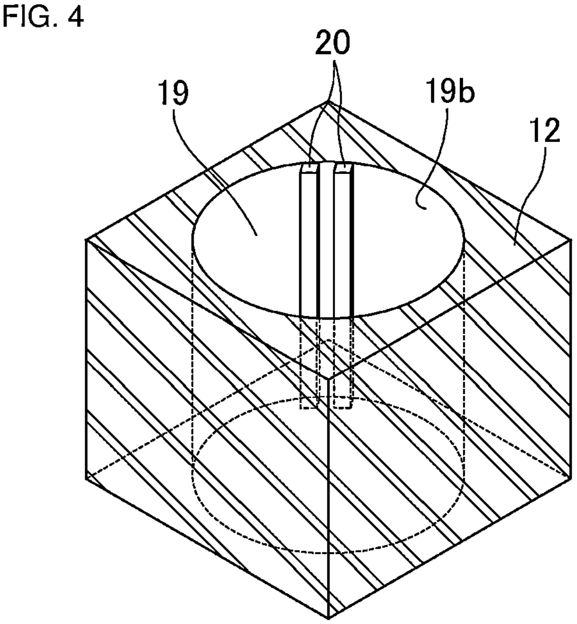
FIG. 4 is an enlarged perspective view of an example of the peripheral portion of the through-hole in FIG. 2.

FIG. 3 is an enlarged top view of an example of a peripheral portion of the through-hole in FIG. 2. FIG. 4 is an enlarged perspective view of an example of the peripheral portion of the through-hole in FIG. 2.

As illustrated in FIG. 4, a raised portion 20 extending along a depth direction of the through-hole 19 is provided on an inner wall 19*b* of the through-hole 19. In a case where the raised portion 20 is provided on the inner wall 19*b* of the through-hole 19, a surface tension of an etching solution decreases and it becomes easier to introduce the etching solution in a case where the hollow portion 13 is formed by a method that will be described later. This can shorten an etching period. As a result, unnecessary damage is less likely to be given to the piezoelectric layer 12.

The raised portion 20 is preferably continuously provided from an upper portion to a lower portion of the through-hole 19, that is, from the first main surface 12*a* to the second main surface 12*b* of the piezoelectric layer 12. In this case, the etching period can be further shortened.

It is preferable that a plurality of raised portions 20 are provided side by side and spaced apart from each other on the inner wall 19*b* of the through-hole 19. In this case, the etching period can be further shortened. Each of the plurality of raised portions 20 provided side by side is preferably continuously provided from the first main surface 12*a* to the second main surface 12*b* of the piezoelectric layer 12.

Figure 5:
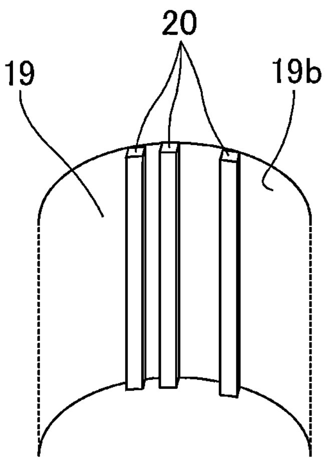
FIG. 5 is a perspective view schematically illustrating an example in which distances between adjacent raised portions are different.

In a case where three or more raised portions 20 are provided on the inner wall 19*b* of the through-hole 19 along the depth direction of the through-hole 19, distances between adjacent raised portions 20 (intervals at which the raised portions 20 are disposed) may be the same as each other or may be different from each other. Note that FIG. 5 is a perspective view schematically illustrating an example in which distances between adjacent raised portions are different.

Figure 6:
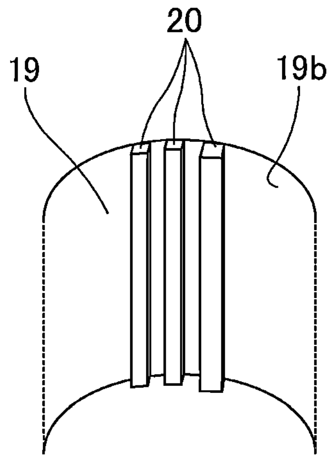
FIG. 6 is a perspective view schematically illustrating an example in which heights of raised portions are different.

In a case where the plurality of raised portions 20 are provided on the inner wall 19*b* of the through-hole 19 along the depth direction of the through-hole 19, heights of the raised portions 20 (sizes in a direction from an outer circumference to an inner circumference of the through-hole 19) may be the same as each other or may be different from each other. Note that FIG. 6 is a perspective view schematically illustrating an example in which the heights of the raised portions are different.

Similarly, in a case where the plurality of raised portions 20 are provided on the inner wall 19*b* of the through-hole 19 along the depth direction of the through-hole 19, lengths of the raised portions 20 (sizes in a direction from the upper portion to the lower portion of the through-hole 19) may be the same as each other or may be different from each other.

A cross-sectional shape of the raised portion 20 perpendicular to the depth direction of the through-hole 19 and a cross-sectional shape of the raised portion 20 parallel with the depth direction of the through-hole 19 are not limited in particular. In a case where the plurality of raised portions 20 are provided on the inner wall 19*b* of the through-hole 19 along the depth direction of the through-hole 19, shapes of the raised portions 20 may be the same as each other or may be different from each other.

Figure 7:
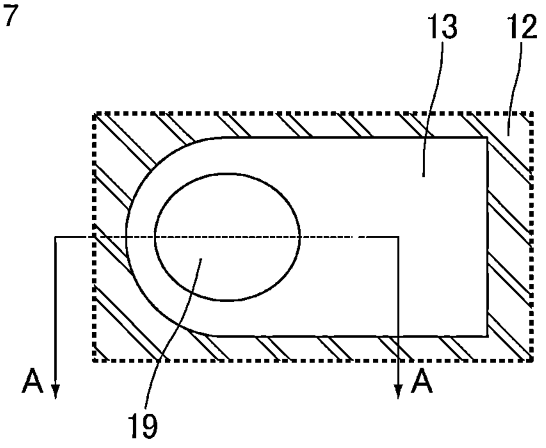
FIG. 7 is an enlarged top view of another example of the peripheral portion of the through-hole in FIG. 2.
Figure 8:
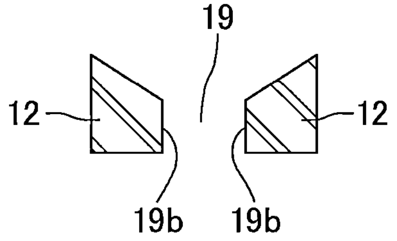
FIG. 8 is a cross-sectional view taken along line A-A in FIG. 7.

FIG. 7 is an enlarged top view of another example of the peripheral portion of the through-hole in FIG. 2. FIG. 8 is a cross-sectional view taken along line A-A in FIG. 7. In FIGS. 7 and 8, the raised portion 20 is omitted.

As illustrated in FIG. 8, the through-hole 19 may have, at an end portion (an upper end portion in FIG. 8) close to the first main surface 12*a* of the piezoelectric layer 12, a reverse tapered shape whose cross-sectional area (or radius) increases toward the first main surface 12*a* of the piezoelectric layer 12. In this case, an angle defined between the inner wall 19*b* of the through-hole 19 and the piezoelectric layer 12 can be made obtuse, and therefore a crack is less likely to occur due to concentration of stress. Furthermore, it becomes still easier to introduce the etching solution into the through-hole 19.

An example of a method for producing the acoustic wave device according to a preferred embodiment of the present invention is described with reference to FIGS. 9 to 15.

Figure 9:
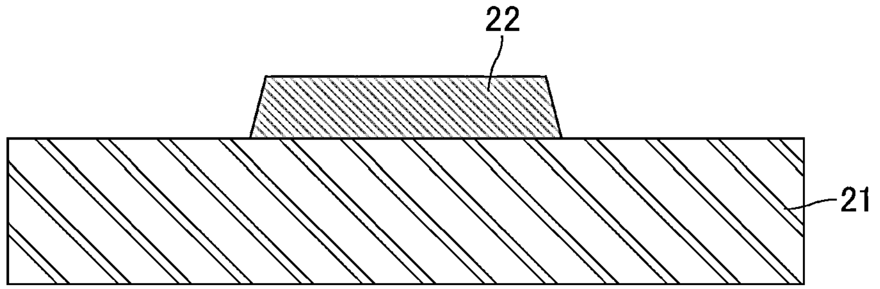
FIG. 9 is a cross-sectional view schematically illustrating an example of a step of forming a sacrificial layer on a piezoelectric substrate.

FIG. 9 is a cross-sectional view schematically illustrating an example of a step of forming a sacrificial layer on the piezoelectric substrate.

As illustrated in FIG. 9, a sacrificial layer 22 is formed on a piezoelectric substrate 21.

As the piezoelectric substrate 21, for example, a substrate made of $LiNbO_3$, $LiTaO_3$, or the like is used.

As a material of the sacrificial layer 22, an appropriate material that can be removed by etching that will be described later is used. For example, ZnO or the like is used.

The sacrificial layer 22 can be, for example, formed by the following method. First, a ZnO film is formed by a sputtering method. Then, resist application, exposure, and development are performed in this order. Next, a pattern of the sacrificial layer 22 is formed by wet etching. Note that the sacrificial layer 22 may be formed by another method.

Figure 10:
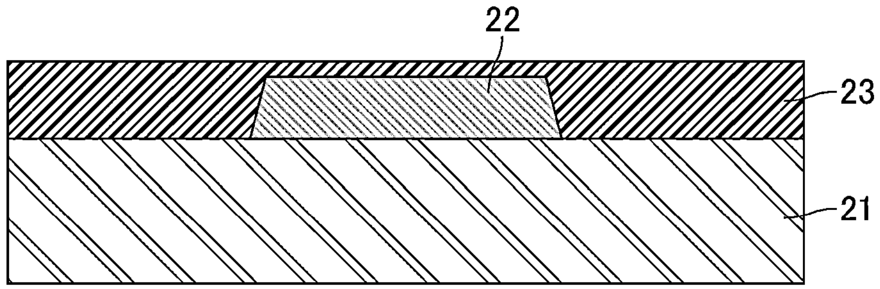
FIG. 10 is a cross-sectional view schematically illustrating an example of a step of forming a joining layer.

FIG. 10 is a cross-sectional view schematically illustrating an example of a step of forming a joining layer.

As illustrated in FIG. 10, a joining layer 23 is formed so as to cover the sacrificial layer 22, and then a surface of the joining layer 23 is flattened.

As the joining layer 23, for example, an $SiO_2$ film or the like is formed. The joining layer 23 can be formed, for example, by a sputtering method or the like. The joining layer 23 can be flattened, for example, by chemical mechanical polishing (CMP) or the like.

Figure 11:
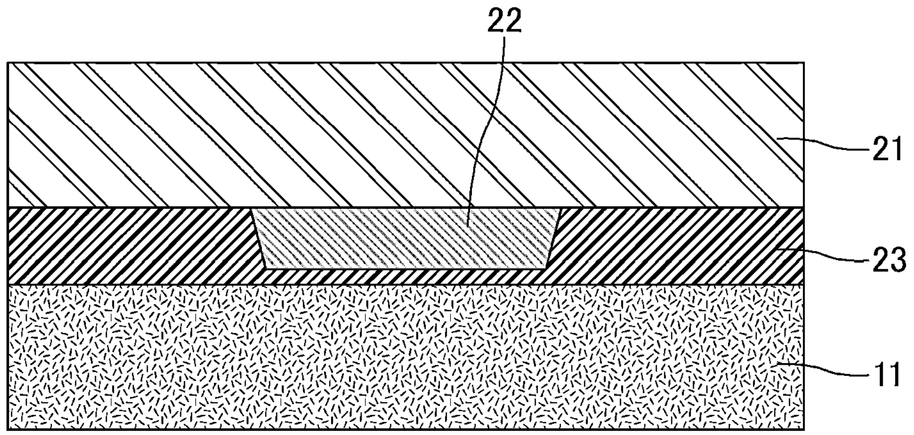
FIG. 11 is a cross-sectional view schematically illustrating an example of a step of joining a support substrate to a joining layer.

FIG. 11 is a cross-sectional view schematically illustrating an example of a step of joining a support substrate to the joining layer.

As illustrated in FIG. 11, the support substrate 11 is joined to the joining layer 23.

Figure 12:
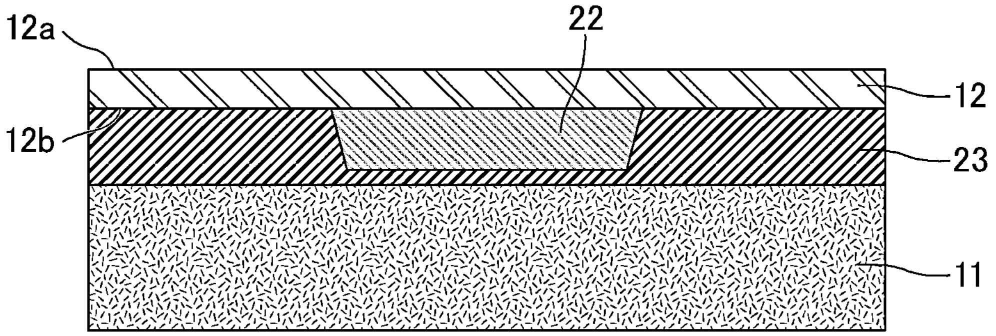
FIG. 12 is a cross-sectional view schematically illustrating an example of a step of thinning the piezoelectric substrate.

FIG. 12 is a cross-sectional view schematically illustrating an example of a step of thinning the piezoelectric substrate.

As illustrated in FIG. 12, the piezoelectric substrate 21 is thinned. In this way, the piezoelectric layer 12 is formed. The piezoelectric substrate 21 can be thinned, for example, by a smart-cut method, polishing, or the like.

Figure 13:
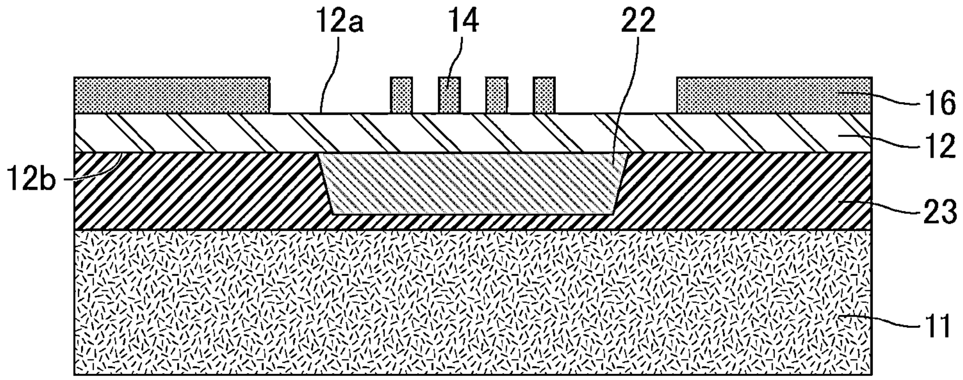
FIG. 13 is a cross-sectional view schematically illustrating an example of a step of forming a functional electrode and a wiring electrode.

FIG. 13 is a cross-sectional view schematically illustrating an example of a step of forming functional electrodes and wiring electrodes.

As illustrated in FIG. 13, the functional electrodes 14 and the wiring electrodes 16 are formed on the first main surface 12*a* of the piezoelectric layer 12. The functional electrodes 14 and the wiring electrodes 16 can be formed, for example, by a lift-off process or the like.

Figure 14:
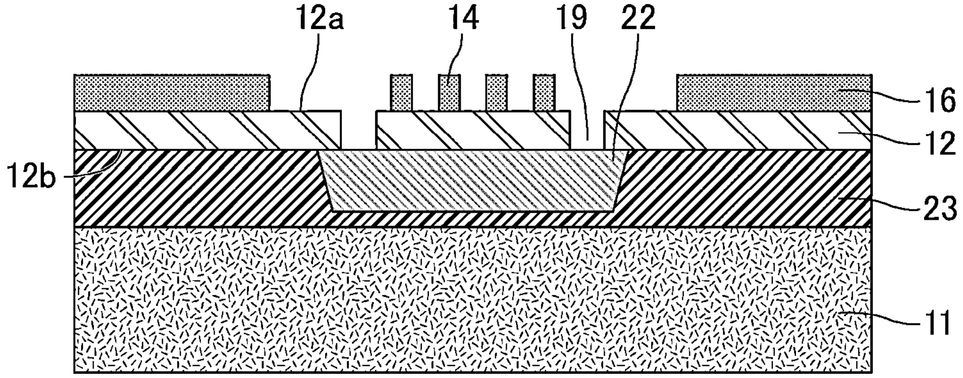
FIG. 14 is a cross-sectional view schematically illustrating an example of a step of forming a through-hole.

FIG. 14 is a cross-sectional view schematically illustrating an example of a step of forming a through-hole.

As illustrated in FIG. 14, the through-hole 19 is formed in the piezoelectric layer 12. Note that the through-hole 19 is formed to reach the sacrificial layer 22. The through-hole 19 can be formed, for example, by a dry etching method or the like. The through-hole 19 is used as an etching hole.

Figure 15:
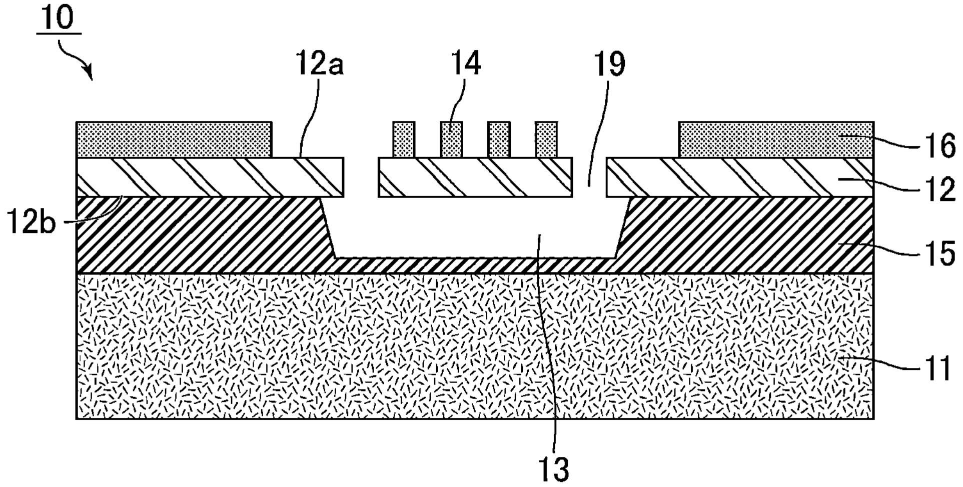
FIG. 15 is a cross-sectional view schematically illustrating an example of a step of removing the sacrificial layer.

FIG. 15 is a cross-sectional view schematically illustrating an example of a step of removing the sacrificial layer.

As illustrated in FIG. 15, the sacrificial layer 22 is removed by using the through-hole 19. In a case where the material of the sacrificial layer 22 is ZnO, the sacrificial layer 22 can be removed, for example, by wet etching using a mixed solution of acetic acid, phosphoric acid, and water (acetic acid:phosphoric acid:water=1:1:10).

In this way, the acoustic wave device 10 is obtained. Note that the raised portion 20 illustrated in FIG. 4 and other drawings can be formed, for example, in the step of forming the through-hole 19.

The following describes details of a thickness-shear mode and a plate wave. Note that a case where the functional electrodes are IDT electrodes is described as an example. In the following example, a support member corresponds to a support substrate according to a preferred embodiment of the present invention, and an insulating layer corresponds to an intermediate layer.

Figure 16:
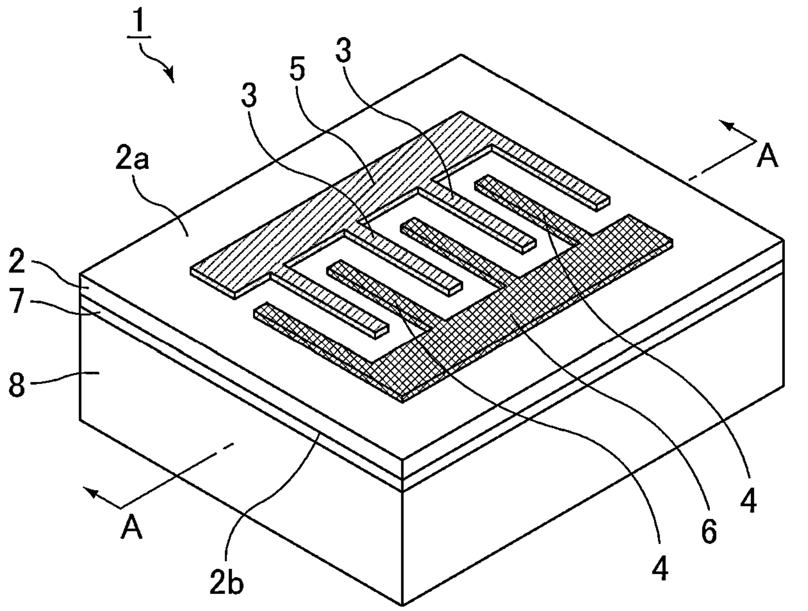
FIG. 16 is a schematic perspective view illustrating outer appearance of an example of an acoustic wave device that uses a bulk wave in a thickness-shear mode.
Figure 17:
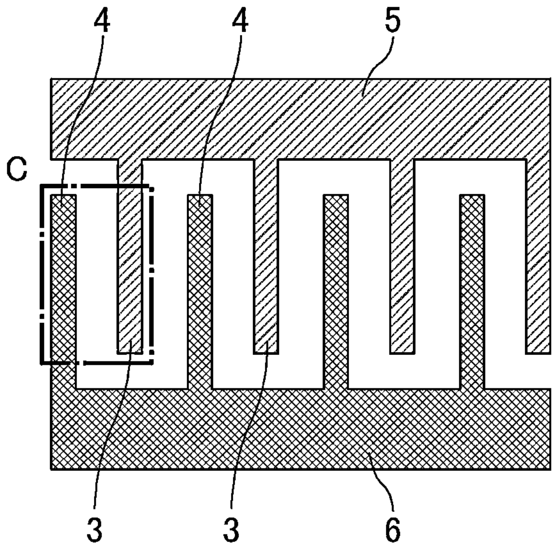
FIG. 17 is a plan view illustrating an electrode structure on a piezoelectric layer of the acoustic wave device illustrated in FIG. 16.
Figure 18:
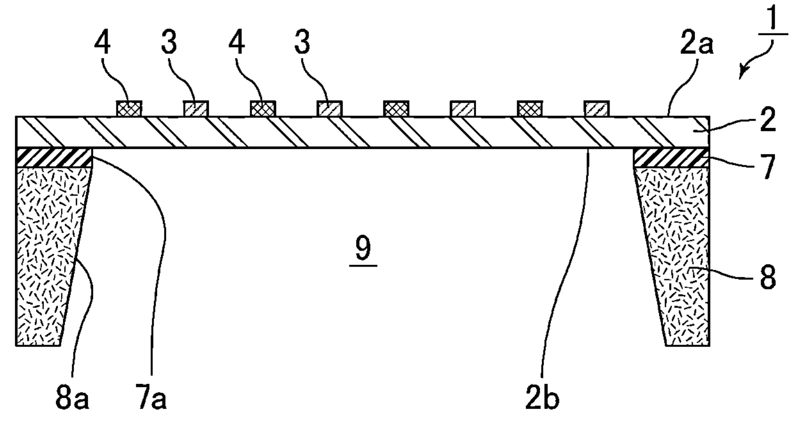
FIG. 18 is a cross-sectional view of a part taken along line A-A in FIG. 16.

FIG. 16 is a schematic perspective view illustrating outer appearance of an example of an acoustic wave device using a bulk wave in a thickness-shear mode. FIG. 17 is a plan view illustrating an electrode structure on a piezoelectric layer of the acoustic wave device illustrated in FIG. 16. FIG. 18 is a cross-sectional view of a portion taken along line A-A in FIG. 16.

An acoustic wave device 1 has, for example, a piezoelectric layer 2 made of $LiNbO_3$. The piezoelectric layer 2 may be made of $LiTaO_3$. Cut-angles of $LiNbO_3$ or $LiTaO_3$ are, for example, Z-cut but may be rotated Y-cut or X-cut. Preferably, a propagation direction is Y propagation and X propagation ± about 30°. A thickness of the piezoelectric layer 2 is not limited in particular, but is preferably about 50 nm or more and about 1000 nm or less to effectively excite the thickness-shear mode. The piezoelectric layer 2 includes a first main surface 2*a* and a second main surface 2*b* that are opposed to each other. An electrode 3 and an electrode 4 are provided on the first main surface 2*a* of the piezoelectric layer 2. The electrode 3 is an example of a "first electrode", and the electrode 4 is an example of a "second electrode". In FIGS. 16 and 17, a plurality of electrodes 3 are a plurality of first electrode fingers connected to a first busbar electrode 5. A plurality of electrodes 4 are a plurality of second electrode fingers connected to the second busbar electrode 6. The plurality of electrodes 3 and the plurality of electrodes 4 interdigitate with each other. The electrodes 3 and the electrodes 4 have a rectangular shape and have a length direction. Each of the electrodes 3 faces an adjacent electrode 4 in a direction orthogonal to the length direction. The plurality of electrode 3, the plurality of electrodes 4, the first busbar electrode 5, and the second busbar electrode 6 define an interdigital transducer (IDT) electrode. The length direction of the electrodes 3 and 4 and the direction orthogonal to the length direction of the electrodes 3 and 4 are directions crossing the thickness direction of the piezoelectric layer 2. It can therefore be said that each of the electrodes 3 faces an adjacent electrode 4 in a direction crossing the thickness direction of the piezoelectric layer 2. The length direction of the electrodes 3 and 4 may be exchanged with the direction orthogonal to the length direction of the electrodes 3 and 4 illustrated in FIGS. 16 and 17. That is, in FIGS. 16 and 17, the electrodes 3 and 4 may extend in a direction in which the first busbar electrode 5 and the second busbar electrode 6 extend. In this case, the first busbar electrode 5 and the second busbar electrode 6 extend in a direction in which the electrodes 3 and 4 extend in FIGS. 16 and 17. Plural pairs of electrode 3 connected to one potential and electrode 4 connected to the other potential that are adjacent to each other are provided in the direction orthogonal to the length direction of the electrodes 3 and 4. A case where the electrode 3 and the electrode 4 are adjacent refers to not a case where the electrode 3 and the electrode 4 are disposed in direct contact with each other, but a case where the electrode 3 and the electrode 4 are disposed apart from each other. In a case where the electrode 3 and the electrode 4 are adjacent, an electrode connected to a signal electrode or a ground electrode, examples of which include another electrode 3 or 4, is not disposed between the electrode 3 and the electrode 4. The number of pairs need not be an integer and may be 1.5, 2.5, or the like. A center-to-center distance, that is, a pitch between the electrodes 3 and 4 is preferably in a range of about 1 μm or more and about 10 μm or less, for example. Note that the center-to-center distance between the electrodes 3 and 4 is a distance connecting a center of a width dimension of the electrode 3 in the direction orthogonal to the length direction of the electrode 3 and a center of a width dimension of the electrode 4 in the direction orthogonal to the length direction of the electrode 4. Furthermore, in a case where at least one of the number of electrodes 3 and the number of electrodes 4 is more than one (a case where there is 1.5 or more pairs of electrodes in a case where the electrodes 3 and 4 are one pair of electrodes), the center-to-center distance between the electrodes 3 and 4 refers to an average of center-to-center distances between adjacent electrodes 3 and 4 among the 1.5 or more pairs of electrodes 3 and 4. A width of the electrodes 3 and 4, that is, a dimension of the electrodes 3 and 4 in a direction in which the electrodes 3 and 4 face each other is preferably in a range of about 150 nm or more and about 1000 nm or less, for example.

In the present preferred embodiment, in a case where a Z-cut piezoelectric layer is used, the direction orthogonal to the length direction of the electrodes 3 and 4 is a direction orthogonal to a polarization direction of the piezoelectric layer 2. This is not the case in a case where a piezoelectric body having different cut-angles is used as the piezoelectric layer 2. The term "orthogonal" as used herein is not limited to being strictly orthogonal and may be substantially orthogonal (an angle defined between the direction orthogonal to the length direction of the electrodes 3 and 4 and the polarization direction is, for example, about 90°±10°).

A support member 8 is laminated on a second main surface 2*b* side of the piezoelectric layer 2 with an insulating layer 7 interposed therebetween. The insulating layer 7 and the support member 8 have a frame shape and have cavities 7*a* and 8*a*, as illustrated in FIG. 18. This defines a hollow portion 9. The hollow portion 9 is provided so that vibration in an excitation region C (see FIG. 17) of the piezoelectric layer 2 is not hindered. Accordingly, the support member 8 is laminated on the second main surface 2*b* with the insulating layer 7 interposed therebetween at a position that does not overlap a portion where at least one pair of electrodes 3 and 4 is provided. Note that the insulating layer 7 need not necessarily be provided. Therefore, the support member 8 can be laminated directly or indirectly on the second main surface 2*b* of the piezoelectric layer 2.

The insulating layer 7 is, for example, made of silicon oxide. Note, however, that not only silicon oxide, but also an appropriate insulating material such as silicon oxynitride or alumina can be used. The support member 8 is made of Si. A plane orientation of Si on a surface on the piezoelectric layer 2 side may be (100) or (110) or may be (111). Preferably, highly-resistive Si having resistivity of about 4 kΩ or higher is desirable, for example. Note, however, that the support member 8 may also be made of an appropriate insulating material or semiconductor material. A material of the support member 8 can be, for example, a piezoelectric body such as aluminum oxide, lithium tantalate, lithium niobate, or crystal, ceramics such as alumina, magnesia, sapphire, silicon nitride, aluminum nitride, silicon carbide, zirconia, cordierite, mullite, steatite, or forsterite, a dielectric such as diamond or glass, or a semiconductor such as gallium nitride.

The plurality of electrodes 3, the plurality of electrodes 4, the first busbar electrode 5, and the second busbar electrode 6 are made of an appropriate metal or metal alloy such as Al or an AlCu alloy. In the present preferred embodiment, the electrodes 3, the electrodes 4, the first busbar electrode 5, and the second busbar electrode 6 have a structure in which an Al film is laminated on a Ti film. Note that a close contact layer other than a Ti film may be used.

For driving, an alternating-current voltage is applied between the plurality of electrodes 3 and the plurality of electrodes 4. More specifically, an alternating-current voltage is applied between the first busbar electrode 5 and the second busbar electrode 6. This makes it possible to obtain resonance characteristics using a bulk wave in a thickness shear mode excited in the piezoelectric layer 2. Furthermore, in the acoustic wave device 1, d/p is about 0.5 or less, for example, in a case where d is a thickness of the piezoelectric layer 2 and p is a center-to-center distance between adjacent electrodes 3 and 4 in any of the plural pairs of electrodes 3 and 4. Therefore, the bulk wave in the thickness-shear mode is effectively excited, and good resonance characteristics can be obtained. More preferably, d/p is about 0.24 or less, for example. In this case, still better resonance characteristics can be obtained. Note that in a case where at least one of the number of electrodes 3 and the number of electrodes 4 is more than one as in the present preferred embodiment, that is, in a case where the number of pairs of electrodes 3 and 4 is 1.5 or more in a case where the electrodes 3 and 4 are regarded as one electrode pair, the center-to-center distance p between adjacent electrodes 3 and 4 is an average of center-to-center distances between adjacent electrodes 3 and 4.

Since the acoustic wave device 1 according to the present preferred embodiment has the above configuration, a Q factor is less likely to decrease even in a case where the number of pairs of electrodes 3 and 4 is decreased to achieve a reduction in size. This is because the acoustic wave device 1 is a resonator that does not necessarily need a reflector on both sides and therefore has small propagation loss. The reflector is not needed because the bulk wave in the thickness-shear mode is used. A difference between a Lamb wave used in a conventional acoustic wave device and the bulk wave in the thickness-shear mode is described with reference to FIGS. 19 and 20.

Figure 19:
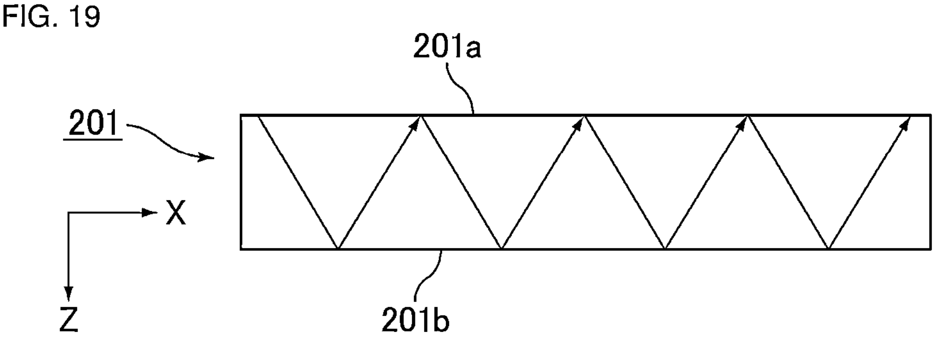
FIG. 19 is a schematic elevational cross-sectional view for explaining a Lamb wave that propagates through a piezoelectric film of the acoustic wave device.

FIG. 19 is a schematic elevational cross-sectional view for explaining a Lamb wave propagating through a piezoelectric film of an acoustic wave device. As illustrated in FIG. 19, a wave propagates through a piezoelectric film 201 as indicated by the arrows in an acoustic wave device such as the one described in Japanese Unexamined Patent Application Publication No. 2012-257019. A first main surface 201*a* and a second main surface 201*b* of the piezoelectric film 201 are opposed to each other, and a thickness direction connecting the first main surface 201*a* and the second main surface 201*b* is the Z direction. The X direction is a direction in which electrode fingers of an IDT electrode are arranged. As illustrated in FIG. 19, the Lamb wave propagates in the X direction. Since the Lamb wave is a plate wave, the piezoelectric film 201 vibrates as a whole, but since the wave propagates in the X direction, resonance characteristics are obtained by disposing a reflector on both sides. Therefore, a propagation loss of the wave occurs, and in a case where a size is reduced, that is, in a case where the number of pairs of electrode fingers is reduced, a Q factor decreases.

Figure 20:
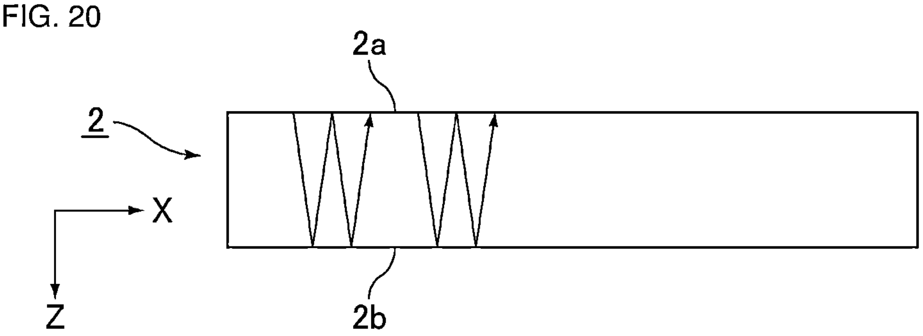
FIG. 20 is a schematic elevational cross-sectional view for explaining a bulk wave in a thickness-shear mode that propagates through a piezoelectric layer of the acoustic wave device.

On the other hand, FIG. 20 is a schematic elevational cross-sectional view for explaining a bulk wave in a thickness-shear mode that propagates through a piezoelectric layer of an acoustic wave device. As illustrated in FIG. 20, in the acoustic wave device 1 according to the present preferred embodiment, vibration displacement occurs in a thickness-shear direction, and therefore the wave almost propagates and resonates in a direction connecting the first main surface 2*a* and the second main surface 2*b* of the piezoelectric layer 2, that is, in the Z direction. That is, an X direction component of the wave is remarkably smaller than a Z direction component. Since resonance characteristics are obtained by propagation of the wave in the Z direction, no reflector is needed. Therefore, propagation loss that occurs due to propagation to a reflector does not occur. Therefore, a Q factor is less likely to decrease even in a case where the number of electrode pairs of the electrodes 3 and 4 is reduced to achieve a reduction in size.

Figure 21:
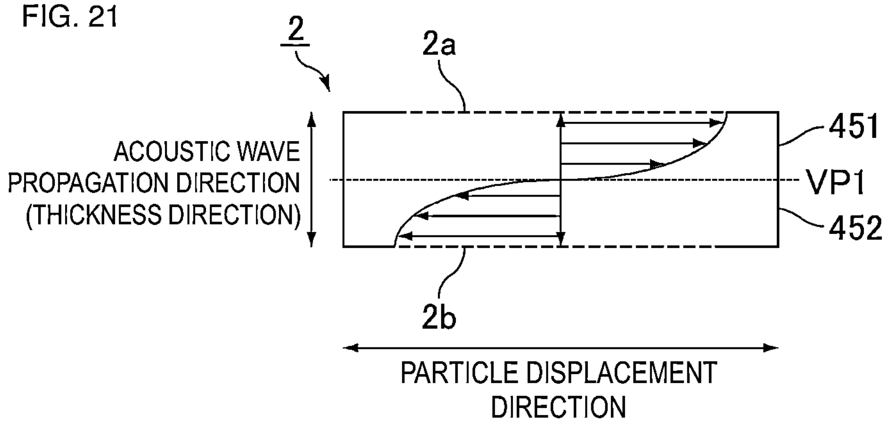
FIG. 21 illustrates an amplitude direction of a bulk wave in a thickness-shear mode.

FIG. 21 illustrates an amplitude direction of a bulk wave in a thickness-shear mode. As illustrated in FIG. 21, the amplitude direction of the bulk wave in the thickness-shear mode in a first region 451 included in the excitation region C of the piezoelectric layer 2 and the amplitude direction of the bulk wave in the thickness-shear mode in a second region 452 included in the excitation region C are reverse. FIG. 21 schematically illustrates a bulk wave in a case where a voltage is applied between the electrode 3 and the electrode 4 so that a potential of the electrode 4 becomes higher than a potential of the electrode 3. The first region 451 is a region of the excitation region C between a virtual plane VP1 that is orthogonal to the thickness direction of the piezoelectric layer 2 and divides the piezoelectric layer 2 into two parts and the first main surface 2*a*. The second region 452 is a region of the excitation region C between the virtual plane VP1 and the second main surface 2*b*.

Although at least one electrode pair of electrodes 3 and 4 is disposed in the acoustic wave device 1 as described above, the number of electrode pairs of electrodes 3 and 4 need not necessarily be plural since the wave is not propagated in the X direction. That is, it is only necessary that at least one electrode pair be disposed.

For example, the electrode 3 is an electrode connected to a hot potential, and the electrode 4 is an electrode connected to a ground potential. Note, however, that the electrode 3 may be connected to the ground potential, and the electrode 4 may be connected to the hot potential. In the present preferred embodiment, the at least one electrode pair is an electrode connected to the hot potential or an electrode connected to the ground potential as described above, and no floating electrode is provided.

Figure 22:
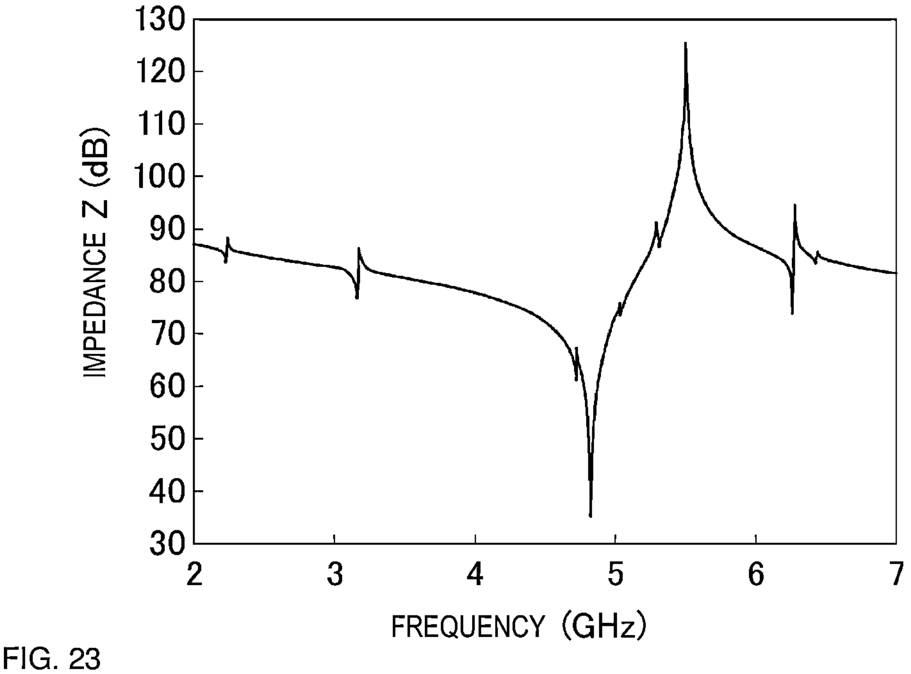
FIG. 22 illustrates an example of resonance characteristics of the acoustic wave device illustrated in FIG. 16.

FIG. 22 illustrates an example of resonance characteristics of the acoustic wave device illustrated in FIG. 16. Note that design parameters of an example of the acoustic wave device 1 for which the resonance characteristics were obtained are as follows.

piezoelectric layer 2: $LiNbO_3$ of Euler angles (0°, 0°, 90°), thickness=400 nm a length of a region where the electrode 3 and the electrode 4 overlap each other when viewed in a direction orthogonal to the length direction of the electrode 3 and the electrode 4, that is, the excitation region C=40 μm the number of electrode pairs of electrodes 3 and 4=21 pairs a center-to-center distance between the electrodes=3 μm a width of the electrodes 3 and 4=500 nm, d/p=0.133.

insulating layer 7: silicon oxide film having a thickness of 1 μm.

support member 8: Si substrate.

Note that the length of the excitation region C is a dimension of the excitation region C along the length direction of the electrodes 3 and 4.

In the acoustic wave device 1, the distances between electrodes in all of the electrode pairs of electrodes 3 and 4 were set equal. That is, the electrodes 3 and the electrodes 4 were disposed at an equal pitch.

As is clear from FIG. 22, good resonance characteristics in which a fractional bandwidth is about 12.5% are obtained although no reflector is provided.

In the present preferred embodiment, d/p is preferably about 0.5 or less, more preferably about 0.24 or less, for example, as described above where d is a thickness of the piezoelectric layer 2 and p is a center-to-center distance between the electrode 3 and the electrode 4. This is described with reference to FIG. 23.

Figure 23:
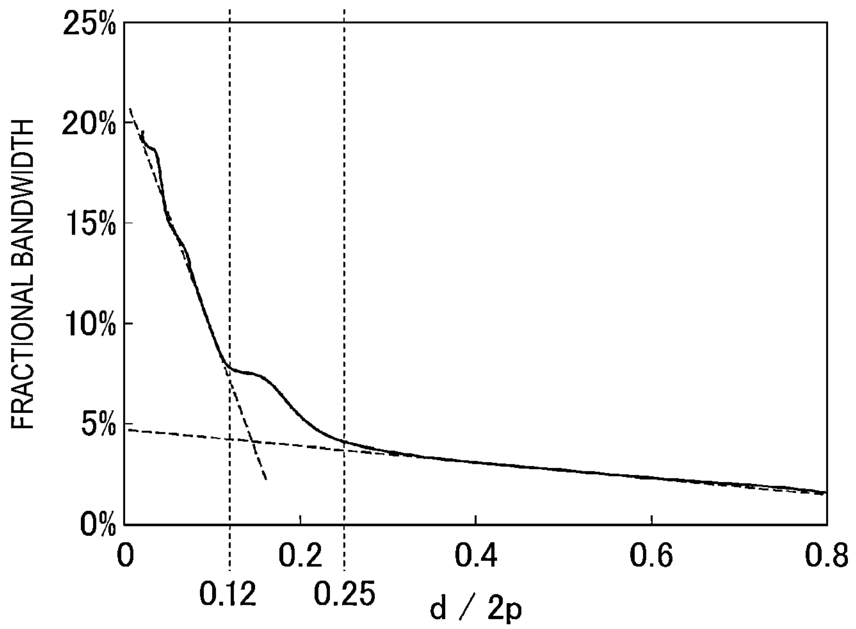
FIG. 23 illustrates a relationship between d/2p where p is a center-to-center distance between adjacent electrodes and d is a thickness of the piezoelectric layer and a fractional bandwidth as a resonator of the acoustic wave device.

A plurality of acoustic wave devices similar to the acoustic wave device for which the resonance characteristics illustrated in FIG. 22 were obtained were obtained by changing d/2p. FIG. 23 illustrates a relationship between d/2p where p is a center-to-center distance between adjacent electrodes and d is a thickness of a piezoelectric layer and a fractional bandwidth as a resonator of the acoustic wave device.

As is clear from FIG. 23, in a case where d/2p is larger than about 0.25, that is, in a case where d/p is larger than about 0.5, the fractional bandwidth is less than about 5% even in a case where d/p is adjusted, for example. On the other hand, in a case where d/2p is equal to or smaller than about 0.25, that is, d/p is equal to or smaller than about 0.5, the fractional bandwidth can be made equal to or higher than about 5%, that is, a resonator having a high coupling coefficient can be obtained by changing d/p within this range, for example. Furthermore, in a case where d/2p is equal to or smaller than about 0.12, that is, d/p is equal to or smaller than about 0.24, the fractional bandwidth can be increased to about 7% or higher, for example. In addition, by adjusting d/p within this range, a resonator having a wider fractional bandwidth can be obtained, and a resonator having a still higher coupling coefficient can be realized. This shows that a resonator having a high coupling coefficient that uses the bulk wave in the thickness shear mode can be obtained by setting d/p equal to or less than about 0.5, for example.

Note that the at least one pair of electrodes may be one pair, and p is a center-to-center distance between adjacent electrodes 3 and 4 in a case where one pair of electrodes is provided. In a case where 1.5 or more pairs of electrodes are provided, an average of center-to-center distances between adjacent electrodes 3 and 4 need just be used as p.

Furthermore, in a case where the piezoelectric layer 2 has thickness variations, an average of the thicknesses need just be used as the thickness d of the piezoelectric layer.

Figure 24:
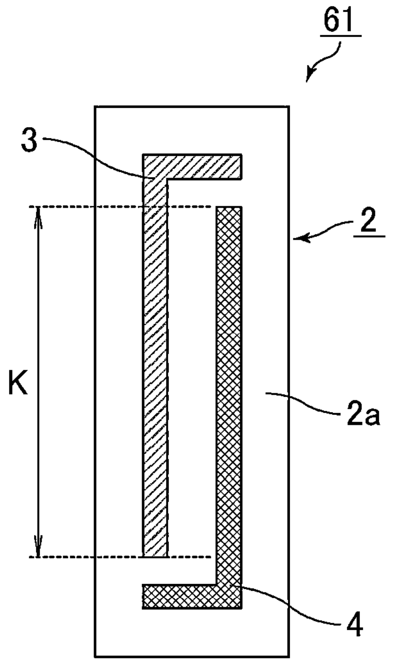
FIG. 24 is a plan view of another example of an acoustic wave device that uses a bulk wave in a thickness-shear mode.

FIG. 24 is a plan view of another example of an acoustic wave device that uses a bulk wave in a thickness shear mode.

In an acoustic wave device 61, one electrode pair having an electrode 3 and an electrode 4 is provided on a first main surface 2*a* of a piezoelectric layer 2. Note that K in FIG. 24 is an intersecting width. As described above, in the acoustic wave device according to the present preferred embodiment, the number of pairs of electrodes may be one. Even in this case, the bulk wave in the thickness shear mode can be effectively excited as long as d/p is about 0.5 or less, for example.

In the acoustic wave device according to the present preferred embodiment, preferably, it is desirable that a metallization ratio MR of the adjacent electrodes 3 and 4 with respect to an excitation region that is a region where the plurality of electrodes 3 and 4 overlap when viewed in a direction in which any adjacent electrodes 3 and 4 face each other satisfies MR≤about 1.75(d/p)+0.075. In this case, spurious can be effectively reduced. This is described with reference to FIGS. 25 and 26.

Figure 25:
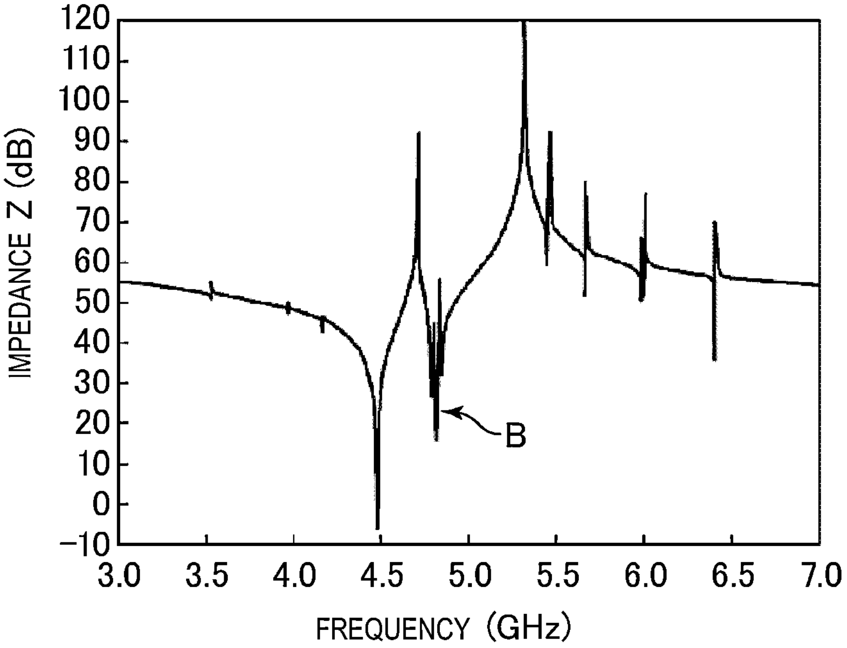
FIG. 25 is a reference view illustrating an example of resonance characteristics of the acoustic wave device illustrated in FIG. 16.

FIG. 25 is a reference view illustrating an example of resonance characteristics of the acoustic wave device illustrated in FIG. 16. Spurious indicated by the arrow B appears between a resonant frequency and an anti-resonant frequency. Note that d/p was set to about 0.08, and Euler angles of $LiNbO_3$ was set to (0°, 0°, 90°), for example. Furthermore, the metallization ratio MR was set to about 0.35, for example.

The metallization ratio MR is described with reference to FIG. 17. In a case where one pair of electrodes 3 and 4 is noted in the electrode structure of FIG. 17, it is assumed that only this pair of electrodes 3 and 4 is provided. In this case, a portion surrounded by the line C with alternate long and short dashes is an excitation region. This excitation region is a region of the electrode 3 that overlaps the electrode 4, a region of the electrode 4 that overlaps the electrode 3, and a region where the electrode 3 and the electrode 4 overlap each other in a region between the electrode 3 and the electrode 4 when the electrode 3 and the electrode 4 are viewed in a direction orthogonal to the length direction of the electrodes 3 and 4, that is, in a direction in which the electrodes 3 and 4 face each other. An area of the electrodes 3 and 4 in the excitation region C with respect to an area of the excitation region is the metallization ratio MR. That is, the metallization ratio MR is a ratio of an area of a metallization part to an area of the excitation region.

Note that in a case where plural pairs of electrodes are provided, a ratio of metallization parts included in all excitation regions to a sum of areas of the excitation regions need just be used as MR.

Figure 26:
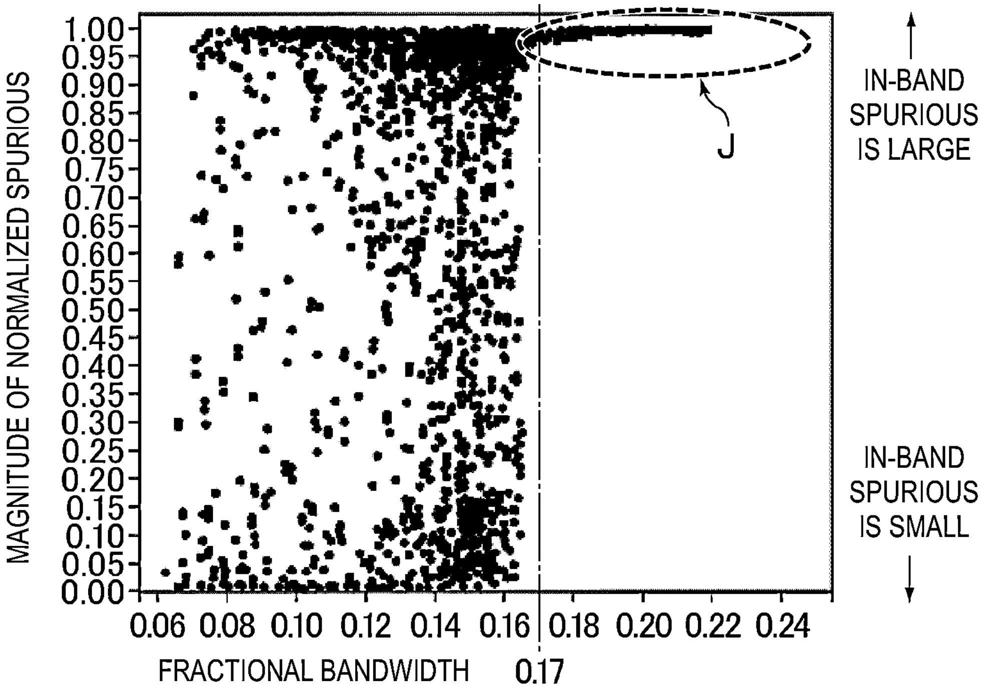
FIG. 26 illustrates a relationship between a fractional bandwidth and a phase rotation amount of impedance of spurious normalized at 180 degrees as a magnitude of spurious in a case where a large number of acoustic wave resonators are obtained according to the present preferred embodiment of the present invention.

FIG. 26 illustrates a relationship between a fractional bandwidth and a phase rotation amount of impedance of spurious normalized at 180 degrees as a magnitude of spurious in a case where a large number of acoustic wave resonators are obtained according to the present preferred embodiment. Note that the fractional bandwidth was adjusted by changing a film thickness of a piezoelectric layer and a dimension of an electrode to various values. Although FIG. 26 illustrates a result obtained in a case where a piezoelectric layer made of Z-cut $LiNbO_3$ is used, similar tendency is obtained even in a case where a piezoelectric layer having different cut-angles is used.

In a region surrounded by the ellipse J in FIG. 26, spurious has a large value of about 1.0, for example. As is clear from FIG. 26, when the fractional bandwidth exceeds about 0.17, that is, about 17%, large spurious having a spurious level of 1 or more appears in a pass band even in a case where parameters constituting the fractional bandwidth are changed, for example. That is, large spurious indicated by the arrow B appears in the band, as indicated by the resonance characteristics illustrated in FIG. 25. Therefore, it is preferable that the fractional bandwidth is 17% or less. In this case, spurious can be reduced by adjusting the film thickness of the piezoelectric layer 2, dimensions of the electrodes 3 and 4, and the like.

Figure 27:
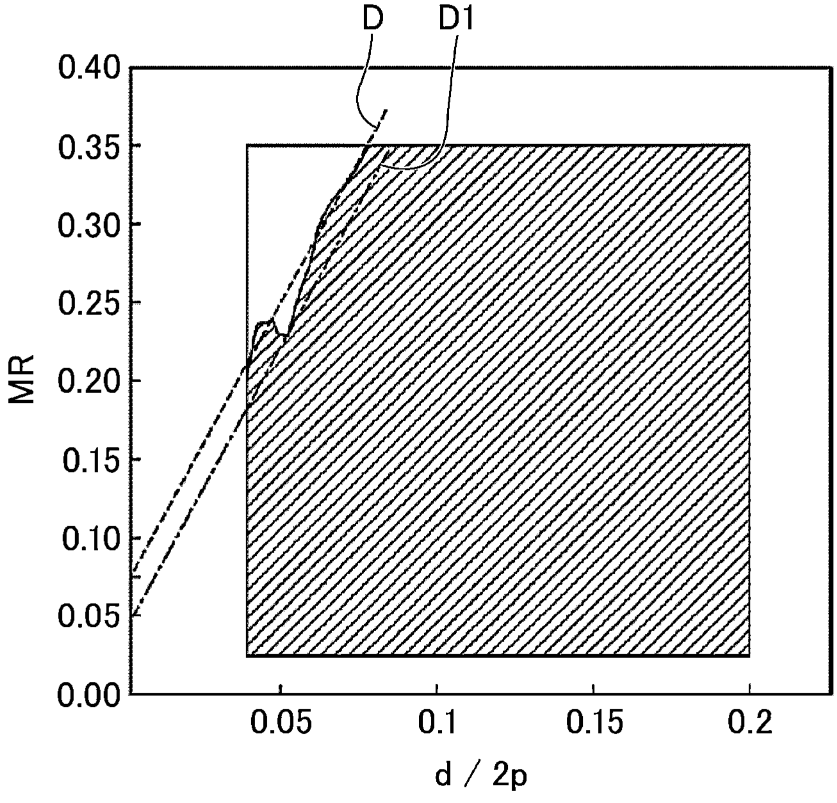
FIG. 27 illustrates a relationship among d/2p, a metallization ratio MR, and a fractional bandwidth.

FIG. 27 illustrates a relationship among d/2p, the metallization ratio MR, and the fractional bandwidth. Various acoustic wave devices that are different in d/2p and MR were obtained on the basis of the acoustic wave device described above, and a fractional bandwidth was measured.

The part with hatching on the right of the broken line D in FIG. 27 is a region where the fractional bandwidth is 17% or less. A boundary between the region with hatching and a region without hatching is expressed by MR=about 3.5(d/2p)+0.075. That is, MR=about 1.75(d/p)+0.075. Accordingly, preferably, MR≤about 1.75(d/p)+0.075. In this case, it is easy to make the fractional bandwidth equal to or less than about 17%, for example. A region on the right side of MR=about 3.5(d/2p)+0.05 indicated by the line D1 with alternate long and short dashes in FIG. 27 is more preferable. That is, the fractional bandwidth can be made equal to or less than about 17% with certainty in a case where MR≤about 1.75(d/p)+0.05, for example.

Figure 28:
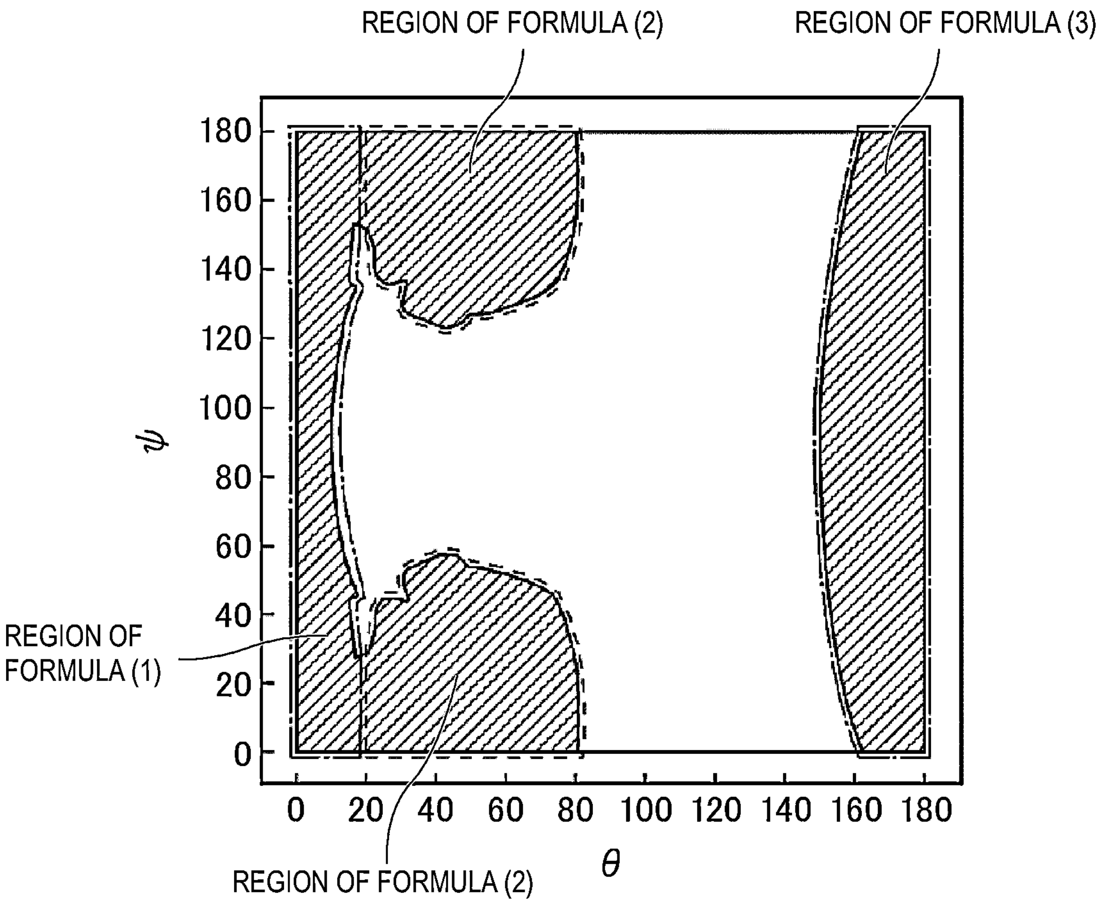
FIG. 28 illustrates a map of a fractional bandwidth with respect to Euler angles (0°, θ, Ψ) of $LiNbO_3$ in a case where d/p is made as close to 0 as possible.

FIG. 28 illustrates a map of a fractional bandwidth with respect to Euler angles (0°, θ, Ψ) of $LiNbO_3$ in a case where d/p is made as close to 0 as possible.

The portions with hatching in FIG. 28 are regions where a fractional bandwidth of about 5% or more is obtained, for example, and ranges of the regions are approximated to ranges expressed by the following formulas (1), (2), and (3).

$$(0°\pm10°, 0° \text{ to } 20°, \text{any } \Psi) \quad \text{formula (1)}$$

$$(0°\pm10°, 20° \text{ to } 80°, 0° \text{ to } 60° (1-(\theta-50)^2/900)^{1/2}) \text{ or } (0°\pm10°, 20° \text{ to } 80°, [180°-60° (1-(\theta-50)^2/900)^{1/2}] \text{ to } 180°) \quad \text{formula (2)}$$

$$(0°\pm10°, [180°-30°(1-(\Psi-90)^2/8100)^{1/2}] \text{ to } 180°, \text{any } \Psi) \quad \text{formula (3)}$$

Therefore, the Euler angle range of the formula (1), (2), or (3) allows the fractional bandwidth to be sufficiently wide and is therefore preferable.

Figure 29:
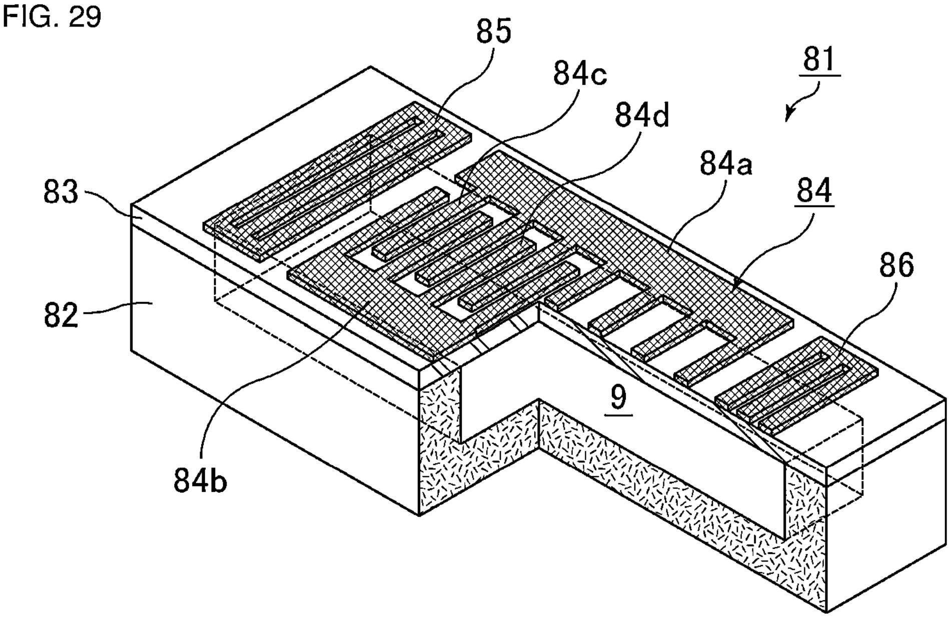
FIG. 29 is a partially cut-away perspective view for explaining an example of an acoustic wave device that uses a Lamb wave.

FIG. 29 is a partially cut-away perspective view for explaining an example of an acoustic wave device that uses a Lamb wave.

An acoustic wave device 81 includes a support substrate 82. The support substrate 82 has a recessed portion opened on an upper surface. A piezoelectric layer 83 is laminated on the support substrate 82. This defines a hollow portion 9. An IDT electrode 84 is provided on the piezoelectric layer 83 so as to be located above the hollow portion 9. Reflectors 85 and 86 are provided on both sides of the IDT electrode 84 in an acoustic wave propagation direction, respectively. In FIG. 29, an outer peripheral edge of the hollow portion 9 is indicated by the broken line. The IDT electrode 84 includes a first busbar electrode 84*a*, a second busbar electrode 84*b*, a plurality of electrodes 84*c* as first electrode fingers, and a plurality of electrodes 84*d* as second electrode fingers. The plurality of electrodes 84*c* are connected to the first busbar electrode 84*a*. The plurality of electrodes 84*d* are connected to the second busbar electrode 84*b*. The plurality of electrodes 84*c* and the plurality of electrodes 84*d* interdigitate with each other.

In the acoustic wave device 81, a Lamb wave as a plate wave is excited by applying an alternating-current electric field to the IDT electrode 84 above the hollow portion 9. Since the reflectors 85 and 86 are provided on both sides, resonance characteristics caused by the Lamb wave can be obtained.

As described above, the acoustic wave device according to a preferred embodiment of the present invention may be one that uses a plate wave such as a Lamb wave.

Alternatively, the acoustic wave device according to a preferred embodiment of the present invention may be one that uses a bulk wave. That is, the acoustic wave device according to a preferred embodiment of the present invention can be applied to a bulk acoustic wave (BAW) element. In this case, the functional electrodes are an upper electrode and a lower electrode.

Figure 30:
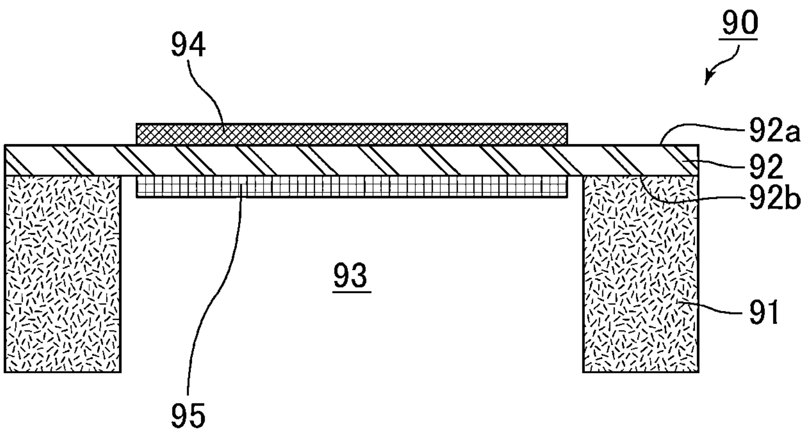
FIG. 30 is a cross-sectional view schematically illustrating an example of an acoustic wave device that uses a bulk wave.

FIG. 30 is a cross-sectional view schematically illustrating an example of an acoustic wave device that uses a bulk wave.

An acoustic wave device 90 includes a support substrate 91. A hollow portion 93 is provided so as to pass through the support substrate 91. A piezoelectric layer 92 is laminated on the support substrate 91. An upper electrode 94 is provided on a first main surface 92*a* of the piezoelectric layer 92, and a lower electrode 95 is provided on a second main surface 92*b* of the piezoelectric layer 92.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:

a piezoelectric layer including a first main surface and a second main surface that are opposed to each other;

a functional electrode on at least one of the first main surface and the second main surface of the piezoelectric layer; and a support substrate on a second main surface side of the piezoelectric layer; wherein a hollow portion is between the support substrate and the piezoelectric layer;

the functional electrode at least partially overlaps the hollow portion when viewed in a laminating direction in which the support substrate and the piezoelectric layer are laminated;

a through-hole extends through the piezoelectric layer and reaches the hollow portion; and a raised portion extending along a depth direction of the through-hole is on an inner wall of the through-hole.

2. The acoustic wave device according to claim 1, wherein the raised portion continuously extends from the first main surface to the second main surface of the piezoelectric layer.

3. The acoustic wave device according to claim 1, wherein a plurality of the raised portions are side by side and spaced apart from each other on the inner wall of the through-hole.

4. The acoustic wave device according to claim 1, wherein the through-hole includes, at an end portion thereof closer to the first main surface of the piezoelectric layer, a reverse tapered shape with a cross-sectional area that increases toward the first main surface.

5. The acoustic wave device according to claim 1, further comprising an intermediate layer between the support substrate and the piezoelectric layer; wherein the hollow portion is in a portion of the intermediate layer.

6. The acoustic wave device according to claim 1, wherein the functional electrode includes one or more first electrodes, a first busbar electrode to which the one or more first electrodes are connected, one or more second electrodes, and a second busbar electrode to which the one or more second electrodes are connected; and the one or more first electrodes, the first busbar electrode, the one or more second electrodes, and the second busbar electrode are on the first main surface of the piezoelectric layer.

7. The acoustic wave device according to claim 6, wherein a thickness of the piezoelectric layer is 2p or less where p is a center-to-center distance between adjacent first and second electrodes among the one or more first electrodes and the one or more second electrodes.

8. The acoustic wave device according to claim 1, wherein the piezoelectric layer is made of lithium niobate or lithium tantalate.

9. The acoustic wave device according to claim 1, wherein the acoustic wave device has a structure operable to use a bulk wave in a thickness-shear mode.

10. The acoustic wave device according to claim 6, wherein d/p≤about 0.5 where d is a thickness of the piezoelectric layer and p is a center-to-center distance between adjacent first and second electrodes among the one or more first electrodes and the one or more second electrodes.

11. The acoustic wave device according to claim 10, wherein d/p≤about 0.24.

12. The acoustic wave device according to claim 6, wherein MR≤about 1.75(d/p)+0.075 where MR is a metallization ratio, which is a ratio of an area of adjacent first and second electrodes among the one or more first electrodes and the one or more second electrodes to an area of an excitation region in which the adjacent first and second electrodes overlap each other when viewed in a direction in which the adjacent first and second electrodes face each other, d is a thickness of the piezoelectric layer, and p is a center-to-center distance between the adjacent first and second electrodes.

13. The acoustic wave device according to claim 12, wherein MR≤about 1.75(d/p)+0.05.

14. The acoustic wave device according to a claim 1, wherein the functional electrode includes an upper electrode on the first main surface of the piezoelectric layer and a lower electrode on the second main surface of the piezoelectric layer.

15. The acoustic wave device according to claim 8, wherein

Euler angles (φ, θ, Ψ) of the lithium niobate or lithium tantalate are within a range of the following formula (1), (2), or (3):

$$(0°\pm10°, 0° \text{ to } 20°, \text{any } \Psi) \quad \text{formula (1)}$$

$$(0°\pm10°, 20° \text{ to } 80°, 0° \text{ to } 60° (1-(\theta-50)^2/900)^{1/2}) \text{ or } (0°\pm10°, 20° \text{ to } 80°, [180°-60° (1-(\theta-50)^2/900)^{1/2}] \text{ to } 180°) \quad \text{formula (2)}$$

$$(0°\pm10°, [180°-30°(1-(\Psi-90)^2/8100)^{1/2}] \text{ to } 180°, \text{any } \Psi) \quad \text{formula (3).}$$

16. The acoustic wave device according to claim 1, wherein the acoustic wave device has a structure operable to use a plate wave.

17. The acoustic wave device according to claim 1, further comprising reflectors on both sides of the functional electrode.

18. The acoustic wave device according to claim 5, wherein the hollow portion passes through the intermediate layer.

19. The acoustic wave device according to claim 5, wherein the hollow portion is provided in at least a portion of the support substrate.

20. The acoustic wave device according to claim 1, wherein the acoustic wave device is a surface acoustic wave device or a bulk acoustic wave device.

* * * * *